United States Patent [19]

Grimes

[11] Patent Number: 4,651,103
[45] Date of Patent: Mar. 17, 1987

[54] PHASE ADJUSTMENT SYSTEM

[75] Inventor: Gary J. Grimes, Thornton, Colo.

[73] Assignees: AT&T Company; AT&T Information Systems Inc., both of Holmdel, N.J.

[21] Appl. No.: 814,541

[22] Filed: Dec. 30, 1985

[51] Int. Cl.⁴ .............................................. H03K 5/26
[52] U.S. Cl. ...................................... 328/72; 328/55; 328/104; 328/154; 307/269; 331/2; 331/47; 331/49
[58] Field of Search ................... 328/72, 154, 155, 55, 328/104; 307/269; 331/2, 47, 49

[56] References Cited

U.S. PATENT DOCUMENTS

| | | | |
|---|---|---|---|
| 3,737,674 | 6/1973 | Butler .................................. | 328/104 |
| 4,185,245 | 1/1980 | Fellinger et al. .................... | 328/104 |
| 4,229,699 | 10/1980 | Frissell ................................ | 307/269 |
| 4,419,629 | 12/1983 | O'Brien ................................ | 328/72 |
| 4,560,939 | 12/1985 | De Karske et al. ................... | 328/55 |

Primary Examiner—John S. Heyman
Attorney, Agent, or Firm—Donald M. Duft

[57] ABSTRACT

Synchronization facilities are disclosed for maintaining error free timing of a digital system when control of the system timing is switched between a plurality of clock sources. The signal of each source is applied to an associated counter divider whose output is applied to switch facilities which extend the output of only one divider at a time as a reference clock source to the digital system. The dividers for the other sources are forcibly reset each time the divider of the reference source advances from its all 1s to its reset (all 0s) position. This maintains the output signals of all dividers in phase with each other to prevent disturbances to the digital system when its timing is switched between clock sources.

9 Claims, 9 Drawing Figures

PHASE ADJUSTMENT SYSTEM

TECHNICAL FIELD

This invention relates to synchronization facilities for a digital system and, more particularly, to facilities for maintaining system timing when the system is switched between a plurality of clock sources.

BACKGROUND OF THE INVENTION

Digital systems, such as digital switching and transmission systems, require an accurate source of clock pulses to synchronize and control their operation. In a stand alone environment in which a digital system is not connected to other systems, the clock pulses may be provided by a source internal to the system. However, as is more typically the case, a digital system is often connectable to and/or must communicate with other digital systems each of which also has its own internal clock source. It is necessary when two or more digital systems communicate with each other that one system send timing information to the other system to synchronize the timing of the two systems. This synchronization is necessary to prevent the loss or mutilation of data transferred between the two systems.

It is therefore necessary that digital systems be capable of being controlled by different timing sources at different times. This requires that the system be controlled by its own internal clock source at certain times and, at other times, that it be controlled from a clock source of one of other systems with which it can communicate.

The switching of a digital system from one clock source to another presents problems with regard to the frequency and phase relationship of the various clock sources. The frequency and phase of these various sources must be precisely controlled so that when a switch is made between sources, there is a minimum of transients in the resulting clock signal received by a controlled system. This is necessary if there is to be a minimal loss or corruption of the data signals then being served by the controlled system.

An obvious solution to this problem would be to equip the various potential clock sources with precision clock circuits of exactly the same frequency and phase so that the controlled system will be oblivious to a timing change when it is switched from one source to another. It is not economically feasible to provide a plurality of clock sources having such frequency and phase capabilities. The achievement of the required frequency stability between a plurality of sources is perhaps attainable. However, it is a problem to keep a plurality of sources in phase synchronization. This is particularly the case in situations where a first one of the sources may comprise a part of the system to be controlled while one or more of the other sources is external to the controlled system and connectable thereto over comunication lines of varying network patterns and lengths.

The length of the communication line interconnecting the remote source with the controlled system is a determining factor regarding the phase of the remote source signal as seen by the controlled system. It is therefore difficult to ensure that no phase differences are encountered when switching from the local clock source to the remote source or vice versa. This difficulty is compounded by the fact that the remote source and the local system may be connectable by different lines at different times with the different lines having different phase and transmission characteristics. Also, it is not feasible to control the phase of the remote source at the controlled system since the same source is independently operated and may be concurrently providing clock signals for a plurality of remotely situated digital systems.

In summary, it is a problem to provide a plurality of clock sources having the identical frequency and phase characteristics so that when the control of a digital system is switched from one source to another, that no frequency or phase disturbances are encountered by the controlled system.

SUMMARY OF THE INVENTION

The present invention provides facilities which permit the control of a digital system to be switched from one clock source to another without encountering phase or frequency disturbances to its timing signal. These clock sources may either be local to the system being controlled or they may be external to the controlled system and connected therewith by communication facilities such as, for example, by a T1 digital transmission system. The various clock sources all have the required frequency stability so that their frequencies are essentially equal to one another. However, it is not possible to control the relative phases of these various sources since they are geographically distinct and connectable to the controlled digital system by different network facilities and paths. The net result is that the phases of these various sources are different so that the switching of the timing input of the digital system from one source to another, without more, would result in unacceptable disturbances to the timing of the controlled system.

In accordance with the invention, the signal of each clock source is applied to an associated counter divider which divides the source signal to provide a lower frequency signal at the output of the divider, such as an 8 kHZ clock signal. The 8 kHZ signal from each divider is applied to switching facilities which extend the 8 kHZ signal from only a selected one of the plurality of sources to the controlled digital system. The switching facilities permit the selection of which one of the 8 kHZ sources is to reference signal that controls the digital system. The other signal sources are kept in phase synchronization with the selected reference source at the output of their associated dividers so that no disturbances are encountered when a switch is made from the current selected reference source to one of the other sources.

The output signal from the divider of the current reference source is applied to a pulse generator which generates a phase adjustment pulse in response to the trailing edge of each pulse generated by the reference divider and extended to the controlled system. This phase adjustment pulse is fed back to a reset input of the dividers associated with the non selected clock sources. This phase adjustment pulse is applied to the dividers at the same time that the divider for the reference source is in its reset or all 0s position. The application of the reset pulse to the dividers for the non selected sources resets them to their 0 position in synchronism with the divider for the current reference source. After being reset, each divider continues to count the signal it receives from its associated signal source. The resetting of the dividers of the non selected sources to 0 in synchronism with the 0 state of the divider of the selected source ensures that the outputs of all dividers are in phase with one another. The frequencies of the various sources are sufficiently close to one another so that frequency differences are not a problem. Thus, the phases of the output signals of the plurality of dividers remain essentially in synchronism with each other as the dividers advance from their 0 position and count the pulses received from their associated clock sources.

Disturbances on the transmission lines extending to the non selected sources may cause transient phase variations. However, these disturbances do not have a chance to accumulate a significant phase difference at the output of their associated divider since any such phase differences will be essentially erased when the divider for the non selected source is reset the next time the counter for the current selected reference source assumes its 0 state.

The provision of a plurality of dividers which are reset to 0 each time the divider for the reference source is in its 0 state provides a mechanism whereby the output signals of all dividers are forced to be in phase with one another except for any small phase disturbances that can accumulate during the time a divider counts from its 0 position to its nth or all 1s position. The amount of phase difference that can accumulate in this time is not of sufficient magnitude to cause any disturbance in the timing of the controlled digital system when the control of the system is switched from a current reference source to another reference source. The provision of the n stage counter provides a granularity of $2^{n-1}$ for adjusting the phase of the non selected reference sources each time the phase adjustment pulse is generated by the current source and applied to the dividers of the non selected sources.

BRIEF DESCRIPTION OF THE DRAWINGS

The invention may be better understood by a reading of the following detailed description of one possible exemplary embodiment thereof taken in conjunction with the accompanying drawings wherein.

DETAILED DESCRIPTION

Figure 1:
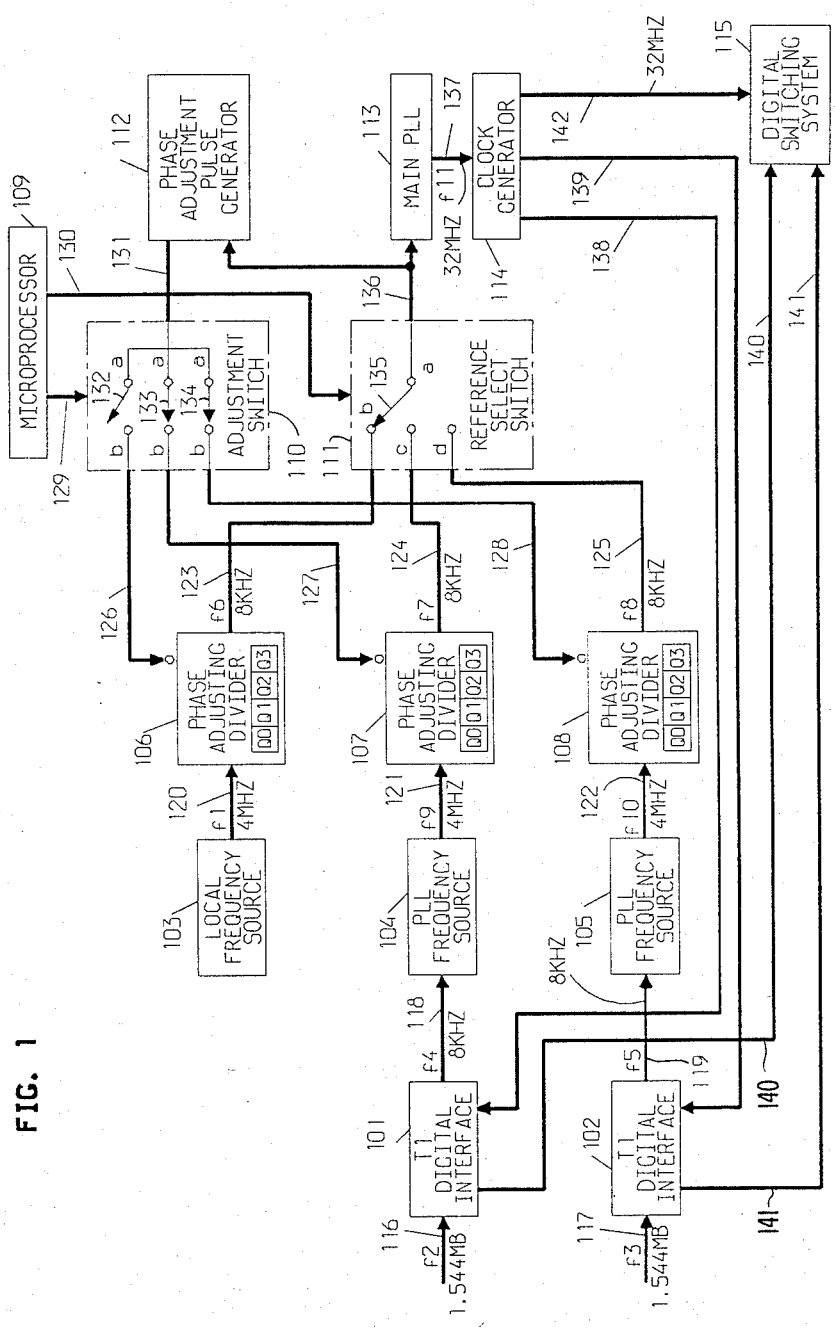
FIG. 1 discloses a system embodying the invention.

One possible exemplary embodiment of the invention is shown on FIG. 1 as comprising three signal sources f1, f2, and f3. Local frequency source 103 applies signal f1 over path 120 to phase adjusting divider 106. T1 digital interfaces 101 and 102 receive sources f2 and f3 and apply output signal f4 and f5 (8 kHZ) over paths 118 and 119 to phase lock loop (PLL) frequency multipliers 104 and 105. Interfaces 101 and 102 are also connected by paths 140 and 141 to digital switching system 115. PLL frequency multipliers 104 and 105 multiply signals f4 and f5 and apply signals f9 and f10 (4 MHz) over paths 121 and 122, respectively, to phase adjusting counter dividers 107 and 108.

Dividers 106 through 108 apply output signals f6, f7 and f8 (8 kHZ) over paths 123, 124, and 125, respectively, to contacts of reference select switch 11. A signal applied by microprocessor 109 over path 130 controls which one of contacts b, c, or d the wiper 135 engages at any time. Wiper 135 is connected by path 136 to main PLL 113. PLL 113 is connected by path 137 to clock generator 114 which is connected by path 142 to digital switching system 115. Clock generator 114 is also connected by paths 138 and 139, respectively, to Digital Interfaces 101 and 102 to control their operation.

Switch 111 applies pulses from the current selected clock source over path 136 to phase adjusting pulse generator 112. Pulse generator 112 applies an output pulse over path 131 to adjustment switch 110 which has contacts 132a and b, 133a and b, and 134a and b. At any given time, only one set of contacts 132a and b, 133a and b, and 134a and b is open while the other two sets of contacts are closed. Microprocessor 109 controls over path 129 which set of contacts 132, 133, and 134 is open at any time and which are closed. Contacts 132b, 133b, and 134b are connected by paths 126, 127, and 128, respectively, to the reset input of phase adjusting dividers 106, 107, and 108.

Signals f2 and f3 received from remote sources contain voice/data information as well as embedded clock information. The remote sources can include remote private branch exchanges (PBXs) and central offices. T1 digital interfaces 101 and 102 derive clock signals f4 and f5 from the received signals f2 and f3 and apply the signals f4 and f5 to frequency multipliers 104 and 105, respectively. The voice/data information in signals f2 and f3 is applied over paths 140 and 141 to digital switching system 115. Local frequency source 103 generates a high frequency signal such as 4 MHz. PLL frequency multipliers 104 and 105 multiply frequencies f4 and f5 to produce frequencies f9 and f10 of 4 MHz that are nominally equal to the 4 MHz signal f1 of local frequency source 103. Dividers 106, 107, and 108 receive signals f1, f9, and f10 and generate signals f6, f7, and f8 of 8 kHZ which are phase adjusted with respective to each other as subsequently explained.

On FIG. 1, signal f6 from divider 106 is the current reference signal, and signals f7 and f8 are the non selected signals that are phase adjusted to signal f6. Wiper 135 of switch 11 engages contact b of path 123 which applies signal f6 over wiper 135 to the input of main PLL 113. Main PLL 113 filters and multiplies signal f6 and applies it as a 32 MHz siganl f11 over path 137 to clock generator 114 which uses signal f11 to generate the clock signals required by digital switching system 115.

Signal f6 is also applied to phase adjusting pulse generator 112 over path 136. Generator 112 generates a phase adjustment pulse for each received trailing edge of signal f6. Since contacts 132a and b are currently open, a phase adjustment pulse is not applied to divider 106. Contacts 133a and b and 134a and b are currently closed so that the phase adjustment pulse on path 131 is applied to dividers 107 and 108. Dividers 107 and 108 are reset by each pulse from generator 112. The resultant respective output signal f7 and f8 of dividers 107 and 108 are forcibly phase adjusted with respect to signal f6 each time their dividers are reset.

One set of contacts 132, 133, and 134 of switch 110 is always open to prevent the adjustment of the divider of the current reference source. The other two sets of contacts of switch 110 are always closed to apply the phase adjustment pulse on path 131 to the other two dividers. Thus, a smooth transition can be made from the old to the new clock signal source when another input of switch 111 is selected when switches 110 and 111 are activated simultaneously. This smooth transition minimizes errors in the signals served by digital switching system 115.

Local signal source f1 and signals f9 and f10 are applied to phase adjusting dividers 106, 107, and 108 which can typically be 74161 counters. Dividers 106, 107, and 108 receive input signals (f1, f9, and f10) and count the pulses in these signals. Dividers 106, 107, and 108 have four stages each. The subject invention uses only the Q3 stage output which is the most significant counter bit. Thus, the outputs f6, f7, and f8 of dividers 106, 107, and 108 are their respective Q3 outputs.

Assume switches 110 and 111 are next adjusted to switch the control of system 115 from signals f1 and f6 to signal f7 which is derived from signal f2. Signal f7 is applied over path 124 to contact c of switch 11. Wiper 135 now engages contact c and extends signal f7 over path 136 to main PLL 113 as well as to phase adjustment pulse generator 112. Main PLL 113 generates signal f11 and applies it over path 137 to clock generator 114 as a 32 MHz signal. Generator 114 receives signal f11 and generates the clock signals required by digital system 115.

Phase adjustment pulse generator 112 generates an adjustment pulse in response to each trailing edge of frequency source f7. This adjustment pulse passes over path 131 to contacts 132, 133, and 134 of switch 110. Contact set 133 is now open because there is no need to adjust frequency source f7 since it is the currently reference signal. Contact sets 132 and 134 are now closed so dividers 106 and 108 can receive phase adjustment pulses to keep signals f6 and f8 in phase with signal f7.

Figure 2:
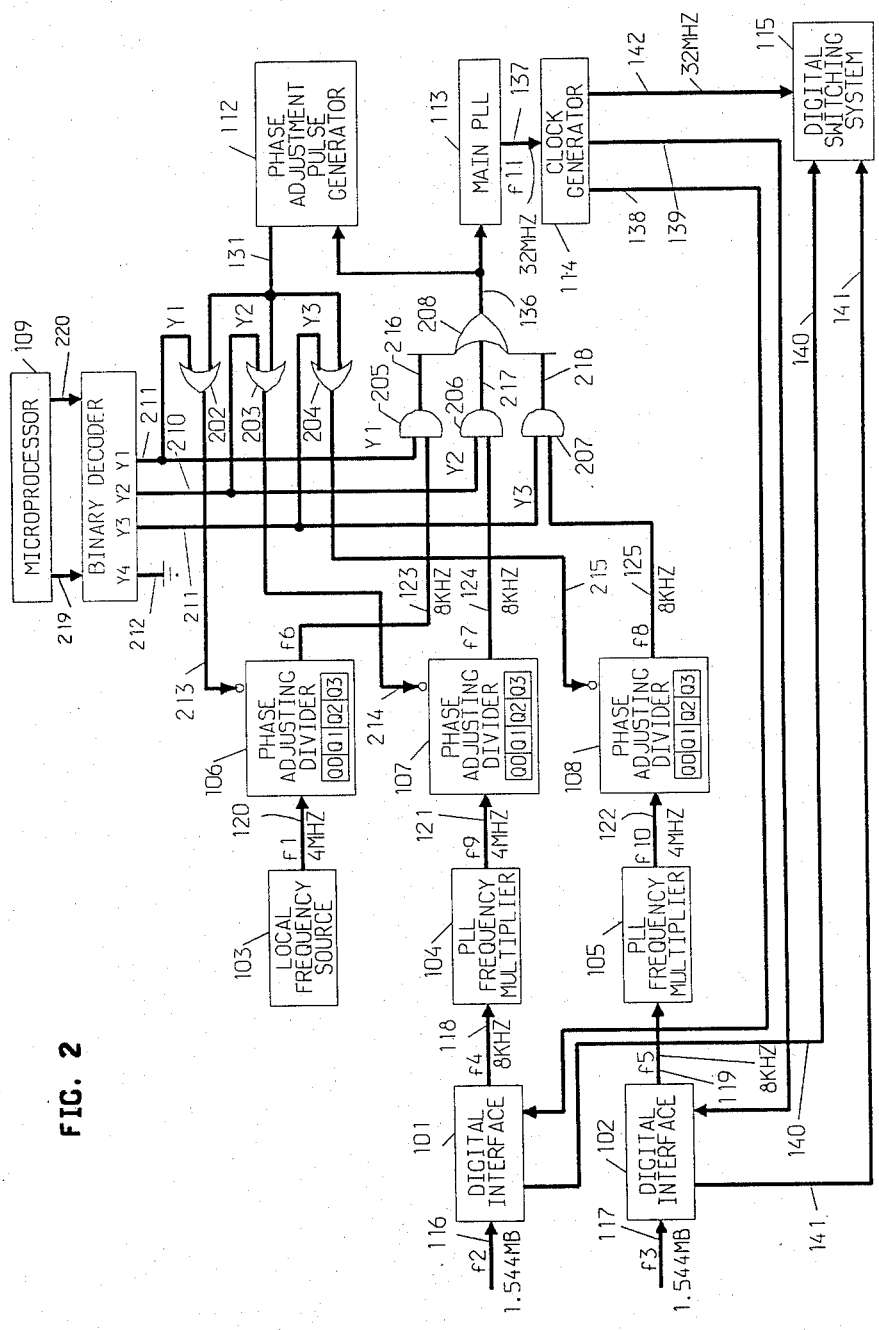
FIG. 2 discloses further details of the system of FIG. 1.

FIG. 2 is similar to FIG. 1 except that binary decoder 201 (74LS139) and logic gates 202 through 208 are shown as comprising contacts 132 through 135 of switches 110 and 111 of FIG.1. Decoder 201 has four outputs, Y1, Y2, Y3, and Y4. Output Y4 is not used. Decoder 201 and its outputs are controlled over paths 219 and 220 by microprocessor 109. The one output Y1, Y2, Y3, or Y4 at a time is high which corresponds to the 00, 01, 10, and 11 states of the two bits applied to decoder 201 by paths 219 and 220. The one output Y1, Y2, and Y3 is high which corresponds to the particular signal source then being used as the reference signal. Output Y1 is high when signal f1 is the reference signal and outputs Y2 and Y3 are then low. Output Y2 is high when signal f7 is the reference signal and outputs Y1 and Y3 are then low. Output Y3 is high when signal f8 is the reference signal and outputs Y1 and Y2 are then low.

Assume signal f1 is currently the reference signal and that it is applied over path 120 to divider 106. Divided down signal f6 is applied over path 123 to AND-gate 205. Since signal f6 is the current reference source, output Y1 from binary decoder 201 is high. This high signal is applied over path Y1 to AND-gate 205 and to OR-gate 202. The high Y1 signal permits signal f6 to pass through AND-gate 205 and over path 216 to OR-gate 208.

Output signals f7 and f8 of dividers 107 and 108 are applied over paths 124 and 125 to AND-gates 206 and 207, respectively. Since signal f6 is the current the reference signal, outputs Y2 and Y3 from decoder 201 are low. The low output Y2 goes to AND-gate 206 and OR-gate 203. The low output Y3 goes to AND-gate 207 and OR-gate 204. Note that at each of AND-gates 206 and 207 that one input is low and one input alternates between low and high. Therefore, gates 206 and 207 remains off and their outputs on paths 217 and 218 are low (0).

Thus, signal f6 is the only signal that now passes to OR-gate 208. The signal P6 passes through gate 208 and over path 136 to PLL 113 and to adjustment pulse generator 112. As described previously, PLL 113 filters, smooths and multiplies signal f6 to generate signal f11 of 32 MHz. Signal f11 passes over path 137 to clock generator 114. Generator 114 uses signal f11 to generate the clock signals required by switching system 115.

Signal f6 is also applied from gate 208 over path 136 to pulse generator 112. Generator 112 uses the signal to generate an adjustment pulse at each trailing edge of the current selected reference signal f6. This adjustment pulse is applied over path 131 to an input on each of OR-gates 202, 203, and 204. Decoder 201 output Y1 is currently high and its outputs Y2 and Y3 are currently low. High output Y1 is applied as an input to OR-gate 202. The resultant output of OR-gate 202 is a steady high which is applied over path 213 to divider 106. Divider 106 is not reset since it requires an active low signal to reset it. Outputs Y2 and Y3 from binary 8 decoder 201 paths Y2 and Y3 are currently low and are applied to OR-gates 203 and 204. The outputs of OR-gates 203 and 204 are the active-low phase adjustment pulses which are sent over paths 214 and 215 to dividers 107 and 108, respectively. The active-low pulses on the reset inputs of dividers 107 and 108 reset dividers 107 and 108 to zero each time an adjustment pulse on path is sent from generator 112.

Figure 3:
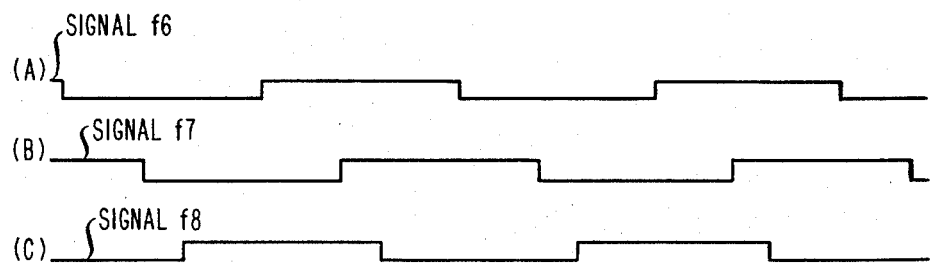
FIGS. 3 through 9 are timing diagrams illustrating further details of the operation of the system of FIGS. 1 and 2.
Figure 4:
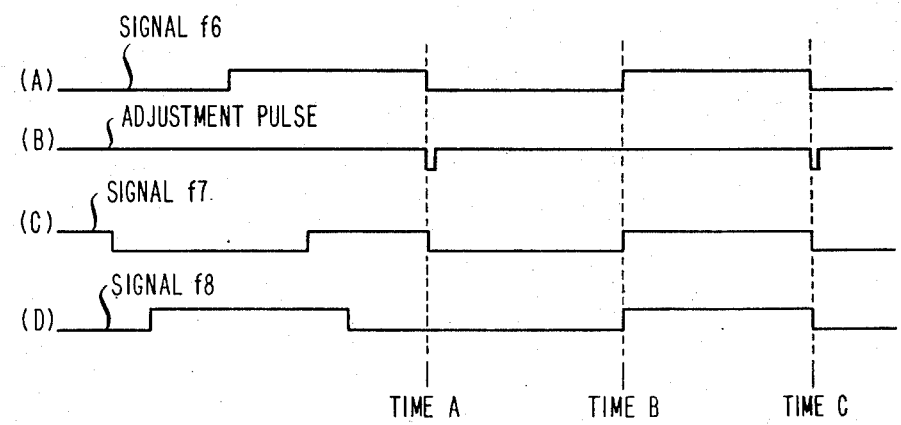

FIG. 3 illustrates three signals f6, f7 and f8 of random phase with no phase adjustmnet. FIG. 4 illustrates the same signals of in FIG. 3 but with signals f7 and f8 phase adjusted with respect to signal f6 by an adjustment pulse from generator 112. The adjustment pulse appears for the first time at time a. The adjustment pulse adjusts signal f7 by resetting divider 107 at time a. This drives the divider's output from a high to a low. Signal f8 is adjusted when divider 108 is reset at time a. This resetting extends the period during which the output of divider 108 is low. All three signals are in phase at times b and c.

Figure 5:
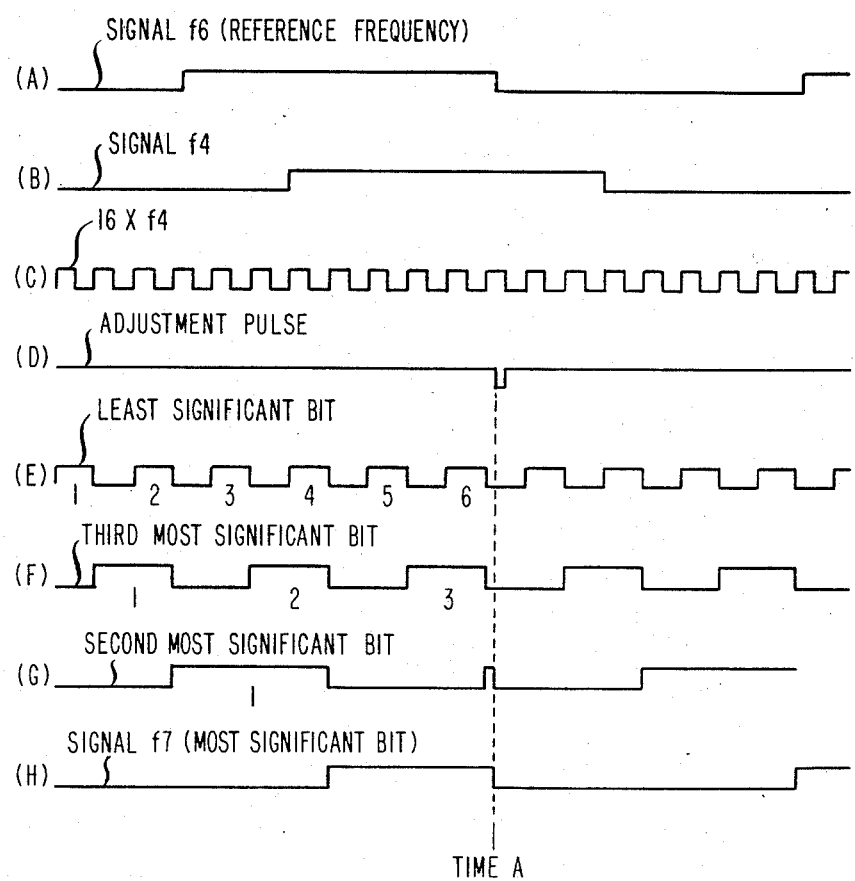

FIG. 5 illustrates greater detail the adjustment of signal f7 with respect to signal f6. Signal f6 is shown in FIG. 5 line a and signal f4 is shown in FIG. 5 line b. Assume that the signals, f6 and f4, are both of 8 kHZ but are out of phase. FIG. 5 line c shows the effects of passing frequency signal f4 through frequency multiplier 104. Assume that multiplier 104 multiplies the incoming f4 signal 16 times rather than 500 as in the case of FIG. 1. FIG. 5 line d shows the phase adjustment pulse that is applied to divider 107 to reset it. The adjustment pulse is generated by the trailing edge of signal f6. FIG. 5 line e through FIG. 5 line h show the affect of the reset pulse on the four stages of divider 107. FIG. 5 line e illustrates the least significant bit (output Q0) which does not change state when the reset pulse is received since it is is already low when the adjustment pulse occurs at time a. In FIG. 5 line f, the third most significant bit waveform (Q1) remains low since it is already low when the adjustment pulse occurs. In FIG. 5 line g, the adjustment pulse resets the high pulse of the second-most significant bit (output Q2) to zero at time a. FIG. 5 line h illustrates the adjustment pulse resetting the high pulse of the most significant bit (output Q3) wave form to zero at time a. Resultant output signal f7 in line h is now in phase with signal f6. Note that with the subject invention, only the most significant bit waveform is used.

Figure 6:
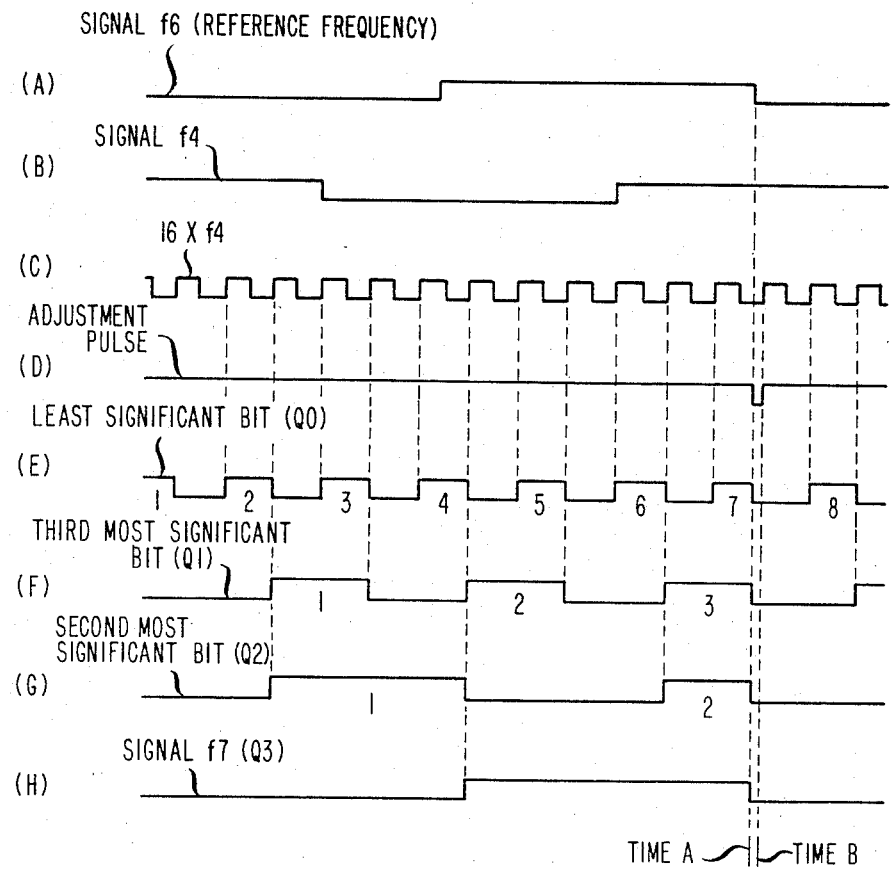

FIG. 6 illustrates signals f6 and f7, where the frequency of f4 is slightly less than f6. FIG. 6 line a and FIG. 6 line b illustrate signals f6 and f4, respectively. FIG. 6 line c illustrates the signal f4 after being multiplied. Assume that multiplier 104 multiplies the f4 signal 16 times. FIG. 6 line d illustrates the phase adjustment pulse at the trailing edge of reference signal f6. FIG. 6 line e through line h illustrates the output of the multiplied f4 signal after passing through divider 107. FIG. 6 line e illustrates the least significant bit waveform (Q0) of divider 107. In this cases, the adjustment pulse resets the seventh high pulse to zero to shorten its duration. In FIG. 6 line f, the adjustment pulse shortens the duration of the third high pulse by resetting the pulse to zero. In FIG. 6 line g, the adjustment pulse resets the second pulse of the second most significant bit waveform. FIG. 6 line h illustrates the adjustment pulse resetting the high pulse of the most significant bit waveform at time a. Note that resultant output signal f7 has the same phase as reference frequency f6 after the application of the phase adjustment pulse.

Figure 7:
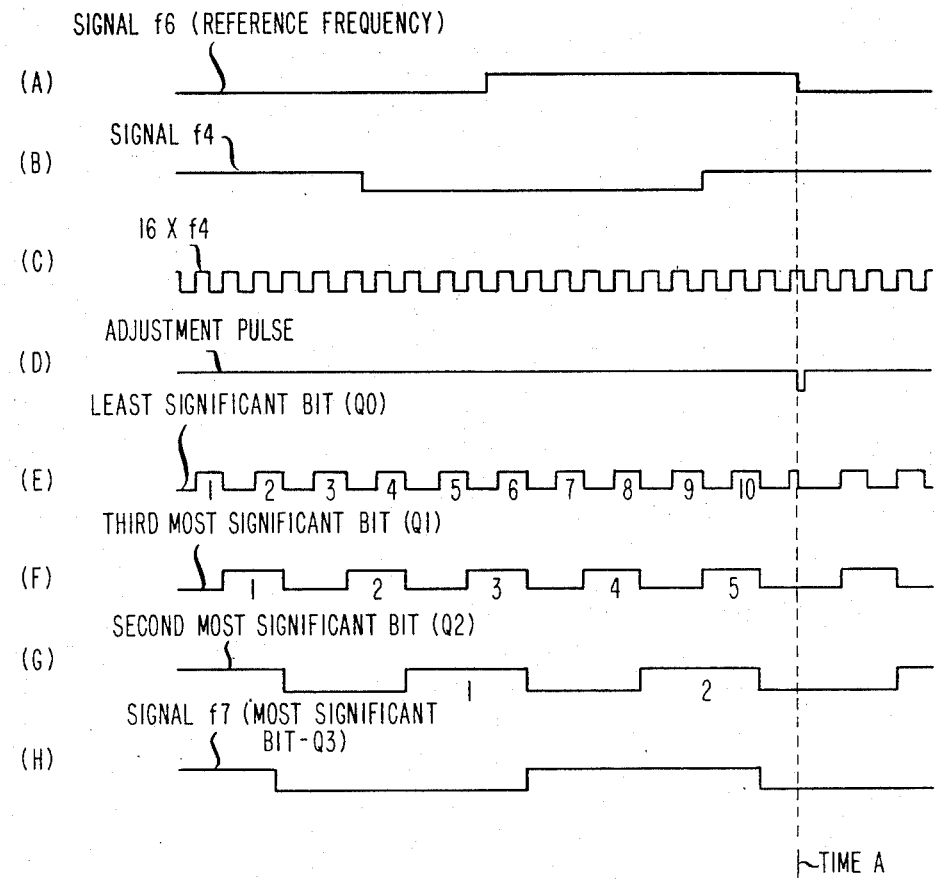

FIG. 7 illustrates signals f4, f6 and f7 where signal f4 is greater than f6. FIG. 7 line a and line b illustrate signals f6 and f4, respectively. FIG. 7 line c illustrates signal f4 after being multiplied 16 times. FIG. 7 line d illustrates the phase adjustment pulse which occurs at the trailing edge of reference signal f6. FIG. 7 line e illustrates the least significant bit of divider 107. Note how the adjustment pulse "cuts short" the "high time" of the eleventh high pulse. In FIG. 7 line f, the adjustment pulse stretches the "low time" of the waveform after the fifth high pulse of the third most significant divider signal (Q1). In FIG. 7 line g, the adjustment pulse stretches the "low time" after the second high pulse of the second most significant divider signal (Q2). FIG. 7 line h illustrates the adjustment pulse stretching the "low time" after the first high pulse of the most significant bit divider signal (Q3).

FIG. 6 illustrates that when the signal to be adjusted is less in frequency than the reference signal (f4<f6), the "up time" of the adjusted signal is shortened each time an adjustment pulse occurs. In FIG. 7, when the signal to be adjusted is greater in frequency than the reference signal (f4>f6), the "down time" of the adjusted signal is lengthened.

Figure 8:
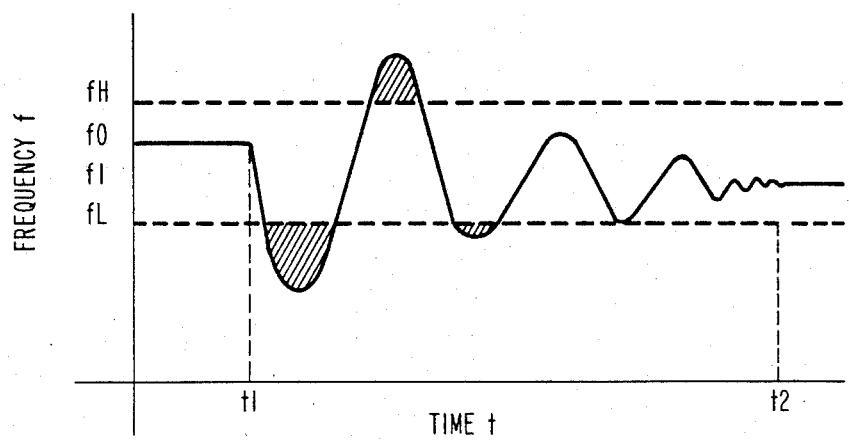

FIG. 8 illustrates the output of main PLL 113 when a switch is made from one signal source to another with no phase adjustment under conditions in which the phases of the two signals do not match. Note the extreme oscillations that occur after time t1 when sources are switched. Tolerance fH is the high-end frequency tolerance and tolerance fL is the low-end frequency tolerance. Note the shaded portion of the waveform which represent the times during which the digital switching system 115 may cause errors and corrupt data because of the out-of-specification clock timing signals as well as the passing of out-of-specification clock timing signals to other switches in a digital network.

Figure 9:
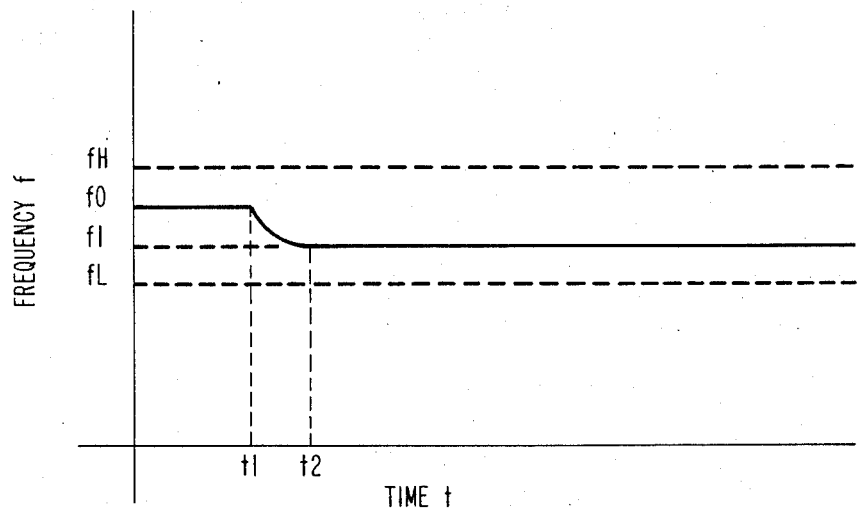

FIG. 9 illustrates the output of main PLL 113 when a switch is made from one signal source to another with the phase adjustment provided by the invention. Note at time t1, the time when sources are switched, that the transition from one source to another is much smoother with the phase adjustment. No errors or corrupted data occur when a phase adjustment of the non selected signals is made as opposed to no phase adjustment situation of FIG. 8. In addition the time interval from t1 to t2 in FIG. 8 is greater than the time interval from t1 to t2 in FIG. 9. It is during the t1 to t2 time intervals that errors and corrupted data may occur in system 115.

In summary, a phase adjustment is necessary for a digital switching system when its timing is switched between clock sources. Without phase adjustment, errors and corrupted data can occur when a switch is made. The invention permits a switch to be made from one signal source to another with no resulting errors in the signals then being served by the controlled digital system.

While a specific embodiment of the invention has been disclosed, variations in structural detail, within the scope of the appended claims, are possible and are contemplated. There is no intention of limitation to what is contained in the abstract or the exact disclosure as herein presented. The above-described arrangements are only illustrative of the application of the principles of the invention Normally, other arrangements may be devised by those skilled in the art without departing from the spirit and the scope of the invention.

What is claimed is:

1. Synchronization facilities for supplying error free timing signals to a utilization system comprising:
   a plurality of signal sources,
   selector means for extending output signals of a selected one of said sources to said utilization system as timing signals,
   means controlled by said output signals of said selected source for maintaining output signals of others of said sources in phase with said output signal of said selected source, and
   selector control means for activating said selector to terminate the extension of said output signals of said selected source and to extend said output signals of one of said other sources to said utilization system as timing signals, said last named means being effective to provide said utilization system with error free timing signals when said selector means extends the output of said one other source to said utilization system.

2. Synchronization facilities for supplying error free timing signals to a utilization system comprising:
   a plurality of signal sources,
   selector means for extending output signals of any selected one of said sources to said utilization system as timing signals,
   a phase control generator responsive to the extension of said signals to said utilization system for generating phase control signals,
   means for applying said phase control signals to the non selected ones of said sources to maintain output signals of said non selected sources in phase with said output signal of said selected source, and
   selector control means for activating said selector to terminate the extension of said output signals of said selected source and to extend said output signals of one of said non selected sources to said utilization system as timing signals, said last named means being effective to provide said utilization system with error free timing signals when said selector means extends the output of said one non selected source to said utilization system.

3. Synchronization facilities for supplying error free clock timing signals to a utilization system comprising:
   a plurality of clock signal means of approximately the same frequency, means for applying a clock signal from each of said clock signal means to a counter divider individual to each of said clock signal means, selector means for extending an output clock signal from any selected one of said dividers to said utilization system as a reference clock timing signal, means for maintaining said output clock signals of all of said dividers in phase with each other by resetting the non selected ones of said dividers each time said selected divider assumes its reset position, and selector control means for activating said selector to terminate the extension of said output signal of said selected divider and to extend said output signal of one of said non selected dividers to said utilization system as as timing signal, said last named means being effective to provide said utilization system with an error free timing signal when said selector means extends said output of said one non selected divider to said utilization system.

4. The system of claim 3 wherein said last named means comprises:
a pulse generator responsive to each clock signal extended to said utilization system for generating a reset pulse, and
means for applying each reset pulse to said non selected dividers to reset said last named dividers to their reset position when said selected divider assumes its reset position.

5. Synchronization facilities for applying timing signals to a utilization system comprising:
local means for generating a signal f1,
a first interface means for receiving a signal f2 and for outputting a signal f4 where said signal f4 is less than said signal f2 in frequency,
a second signal interface means for receiving a signal f3 and for outputting a signal f5 where said signal f5 is less than said signal f3 in frequency,
a first frequency multiplier means for multiplying the frequency of said signal f4 to a signal f9 where said signal f9 is essentially equal in frequency to said signal f1,
a second frequency multiplier means for multiplying the frequency of said signal f5 to a signal f10 where said signal f10 is essentially equal in frequency to said signals f1 and f9,
a plurality of counter dividers with each divider being individual to one of said signals f1, f9 and f10,
said dividers being effective to divide the frequency of said signals f1, f9 and f10, respectively, to lower frequency signals f6, f7 and f8, respectively,
selector means for extending any selected one of said signals f6, f7 or f8 to said utilization system as a timing signal,
means for applying said one extended signal to a phase adjustment generator,
said generator being responsive to the receipt of said extended signal for generating a reset pulse,
means for applying said reset pulse to the said dividers of the non selected ones of said signals, f6, f7 and f8 to reset said last name dividers to a reset position when the divider associated with said selected one of said signals f6, f7 and f8 assumes its reset position, and
selector control means for activating said selector to terminate the extension of said selected signal and to extend one of said non selected signals f6, f7, or f8 to said utilization system as a timing signal, said last named means being effective to provide said utilization system with error free timing signals when said selector means extends said one non selected signal to said utilization system.

6. A method of operating synchronization facilities for supplying error free clock timing signals to a utilization system, said method comprising the steps of:
extending an output signal of a selected one of a plurality of sources to said utilization system as a timing signal,
using said output signal of said selected source for maintaining output signals of others of said sources in phase with said output signal of said selected source, and
terminating the extension of said output signal of said selected source and extending an output signal of one of said other sources to said utilization system as a timing signal, thereby to provide an error free source of timing signals to said utilization system when said output signal of said one other source is extended to said utilization system as a timing signal.

7. A method of operating synchronization facilities for supplying timing signals to a utilization system, said method comprising the steps of;
extending an output signal of any selected one of a plurality of sources to said utilization system as a timing signal,
a generating phase control signals in response to the extension of said signal to said utilization system,
applying said phase control signals to the non selected ones of said sources to maintain output signals of said non selected sources in phase with said output signal of said selected source, and
terminating the extension of said output signal of said selected source and extending an output signal of one of said non selected sources to said utilization system as a timing signal, thereby to provide an error free source of timing signals to said utilization system when said output signal of said one non selected source is extended to said utilization system.

8. A method of operating synchronization facilities for supplying error free clock timing signals to a utilization system said method comprising the steps of:
applying a clock signal from each of a plurality of clock means of essentially the same frequency to a counter divider individual to each of said clock means,
extending an output clock signal from a selected one of said dividers to said utilization system as a reference clock signal,
maintaining output clock signals of all of said dividers in phase with each other by resetting the non selected ones of said dividers each time said selected divider assumes its reset position, and
terminating the extension of said output clock signal of said selected divider and extending an output clock signal of one of said non selected dividers to said utilization system as a timing signal, thereby to provide an error free source of timing signals to said utilization system when said output clock signal of said one non selected divider is extended to said utilization system.

9. The system method of claim 8 in combination with the steps of:
generating a reset pulse in response to each clock signal extended to said utilization system, and
applying each reset pulse to said non selected dividers sources to reset said last named dividers to their reset position when said selected divider assumes its reset position.

* * * * *